(12) United States Patent
Fujisawa et al.

(10) Patent No.: US 8,512,873 B2
(45) Date of Patent: Aug. 20, 2013

(54) SURFACE TREATED COPPER FOIL AND COPPER CLAD LAMINATE

(75) Inventors: Satoshi Fujisawa, Tokyo (JP); Yuji Suzuki, Tokyo (JP); Takeo Uno, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/055,353

(22) PCT Filed: Jul. 22, 2009

(86) PCT No.: PCT/JP2009/063095
§ 371 (c)(1),
(2), (4) Date: Apr. 21, 2011

(87) PCT Pub. No.: WO2010/010893
PCT Pub. Date: Jan. 20, 2010

(65) Prior Publication Data
US 2011/0189499 A1    Aug. 4, 2011

(30) Foreign Application Priority Data

Jul. 22, 2008   (JP) .................................. 2008-188748

(51) Int. Cl.
*B32B 15/20*   (2006.01)
(52) U.S. Cl.
USPC ........... 428/607; 428/612; 428/671; 428/675; 428/680; 428/687
(58) Field of Classification Search
USPC .................. 428/607–626, 671, 675, 680, 687
See application file for complete search history.

(56) References Cited

U.S. PATENT DOCUMENTS

| | | | | |
|---|---|---|---|---|
| 3,585,010 A | * | 6/1971 | Luce et al. ....................... 28/608 |
| 4,640,747 A | * | 2/1987 | Ueno et al. ...................... 156/151 |
| 5,622,782 A | * | 4/1997 | Poutasse et al. ............... 428/344 |
| 6,117,300 A | * | 9/2000 | Carbin et al. .................. 205/125 |
| 6,183,880 B1 | * | 2/2001 | Yoshioka et al. ............. 428/607 |
| 6,329,074 B1 | * | 12/2001 | Fujiwara et al. .............. 428/632 |
| 6,984,456 B2 | * | 1/2006 | Okada et al. ................... 428/621 |
| 6,989,199 B2 | * | 1/2006 | Yamamoto et al. ........... 428/607 |
| 7,615,277 B2 | * | 11/2009 | Takai et al. .................... 428/209 |
| 7,691,487 B2 | * | 4/2010 | Nagatani ........................ 428/607 |
| 7,883,783 B2 | * | 2/2011 | Nagatani ........................ 428/626 |
| 2007/0237976 A1 | | 10/2007 | Okada et al. | |

FOREIGN PATENT DOCUMENTS

| | | |
|---|---|---|
| EP | 1 645 662 A1 | 4/2006 |
| JP | 11 256389 | 9/1999 |
| JP | 2000 269637 | 9/2000 |
| JP | 2005 344174 | 12/2005 |
| JP | 2007 314855 | 12/2007 |
| WO | 2004 005588 | 1/2004 |

OTHER PUBLICATIONS

International Search Report issued Nov. 2, 2009 in PCT/JP09/063095 filed Jul. 22, 2009.
U.S. Appl. No. 13/055,375, filed Jan. 21, 2011, Fujisawa, et al.
U.S. Appl. No. 13/574,478, filed Jul. 20, 2012, Fujisawa et al.

* cited by examiner

*Primary Examiner* — Cathy Lam
(74) *Attorney, Agent, or Firm* — Oblon, Spivak, McClelland, Maier & Neustadt, L.L.P.

(57) ABSTRACT

To provide a surface treated copper foil satisfying all of the bonding strength to polyimide film, chemical resistance, and etching property, and to provide a CCL using the surface treated copper foil, a surface treated copper foil is formed being comprising an untreated copper foil on at least one surface of which Ni—Zn alloy is deposited, wherein Zn content (wt %)=Zn deposition amount/(Ni deposition amount+Zn deposition amount)×100 is 6% or more and 15% or less, and Zn deposition amount is 0.08 mg/dm$^2$ or more, or, a CCL is formed being comprising a surface treated copper foil and a polyimide film laminated on the surface treated copper foil, wherein the surface treated copper foil comprises an untreated copper foil on at least one surface of which Ni—Zn alloy is deposited, Zn content (wt %)=Zn deposition amount/(Ni deposition amount+Zn deposition amount)×100 is 6% or more and 15% or less, and Zn deposition amount is 0.08 mg/dm$^2$ or more.

2 Claims, No Drawings

SURFACE TREATED COPPER FOIL AND COPPER CLAD LAMINATE

TECHNICAL FIELD

The present invention relates to surface treated copper foil, particularly relates to a surface treated copper foil suitable for CCL; copper clad laminate (hereafter it may be referred as CCL) which is bonded with polyimide film at high temperature and used, and relates to CCL being capable of forming a precise circuit using the copper foil.

BACKGROUND ART

In a CCL use copper foil, when bonding the copper foil to a resin substrate, it is necessary to improve its bonding strength and satisfy required electrical property, etching property, heat resistance, and chemical resistance as a printed circuit board. For this reason, roughening treatment is applied to the bonding surface of the copper foil to be bonded with the resin substrate after the foil is produced (hereinafter sometimes described as the "untreated copper foil"), further zinc (Zn) plating, nickel (Ni) plating, or the like is applied to the top of the roughened surface, still further chromate treatment etc. are applied to the top of the surface plated with the Zn, plated with the Ni, and a variety of other techniques are applied.

Recently, IC mounted boards driving liquid crystal displays of display parts of PCs, mobile phones, and PDAs are becoming increasingly advanced in density. In the production processes thereof accurate circuit configurations and a treatment at a high temperature are demanded.

To respond to such demands, as a copper clad laminate for producing printed circuit boards, for a response to demands for accurate circuit configurations and treatment at a high temperature, a CCL is provided in which an electrodeposited copper foil capable of forming accurate conductive circuits and a polyimide film which is resin substrate capable of being used at a high temperature are bonded together. In the CCL, the copper foil and the polyimide are bonded by thermal adhesion at high temperature of several hundreds of degrees.

For this bonding treatment at the high temperature, improvement of the bonding strength of the copper foil with the polyimide film has become the pressing issue. As a means for solving this problem, the technique of roughening treatment of the surface of the copper foil by a Zn-containing alloy is disclosed in for example PLT 1.

Further, as a means for bonding a copper foil and a polyimide film at a high temperature, a surface treated copper foil obtained by treating the surface of untreated copper foil for bonding with a polyimide film by an electroplating solution containing at least one element selected from among molybdenum, iron, cobalt, nickel, and tungsten and further providing a Ni plating layer or Zn plating layer or else a Ni plating layer plus a Zn plating layer on this plating layer has been proposed (see PLT 2).

The roughened layer including a Zn layer disclosed in the above PLT 1 and PLT 2 has an advantageous effect in the point that the bonding strength between the copper foil and the polyimide film (resin substrate) at a high temperature is improved. However, if forming a conductive circuit by etching treatment by an acidic solution after bonding the copper foil to the polyimide film (resin substrate) and constituting a circuit board, even the Zn layer which bonds the copper foil and the polyimide film (resin substrate) begins to dissolve since zinc is easily dissolved by acid, so there is apprehension that the bonding strength between the copper foil and the polyimide film (resin substrate) after forming the circuit will sharply fall and accidents of the conductive circuit peeling off from the polyimide film (resin substrate) during use of the circuit board will occur. In order to prevent such accidents, it was necessary to shorten the etching time and keep the dissolution and outflow of the Zn layer to the lowest limit, therefore advanced technology and management systems were needed for the etching treatment, so there were the disadvantages that the productivity of the circuit boards was reduced and costs became higher.

In this way, with the roughening treatment of copper foil disclosed in the above PLT 1 and PLT 2, as described above, the bonding strength with respect to the polyimide film, chemical resistance, and etching property could not be all satisfied. And in the present state, a surface treated foil satisfying all of them has never been provided.

Furthermore, a CCL satisfying all of the bonding strength, chemical resistance, and etching property has never been provided.

And in the PLT 3, as a surface treatment of a copper foil, Ni—Zn plating is performed using pyrophosphoric acid bath for plating bath, and CCL comprised of the surface treated copper foil and polyimide film is proposed. It is disclosed that by using the pyrophosphoric acid bath, Ni—Zn alloy layer being excellent in film thickness uniformity is obtained, and the phenomenon of penetration of tin into the interface between the circuit and the polyimide resin substrate is hard to occur when the tin plating is performed to the terminal area after the circuit is formed.

However, in the plating using the pyrophosphoric acid bath, it is known that P is codeposited in the plated coating, which has property of high solubility due to the codeposited P. According to that property, when the copper foil is etched to form a circuit and tin plating is performed on the terminal area of thus formed circuit, the phenomenon of penetration of tin plating solution (deterioration of chemical resistance) is not able to be prevented sufficiently, the surface treated layer is deteriorated by the tin plating solution, and there is a failure that an influence happens on the adhesion property of wiring circuit.

In recent years, the pitch of the circuit is becoming finer and the width of wiring circuit is becoming finer, and bonding area between the circuit and the resin substrate is decreasing. In such a fine pitch circuit, when the phenomenon of penetration of tin plating solution occurs, the adhesion property of circuit deteriorates and a problem of reliability occurs, therefore a copper foil is desired which is capable of suppressing this phenomenon of penetration of tin plating solution.

CITATION LIST

Patent Literature

PLT 1: Japanese Patent Publication (A) No. 2000-269637
PLT 2: Japanese Patent Publication (A) No. 11-256389
PLT 3: Japanese Patent Publication (A) No. 2005-344174

SUMMARY OF INVENTION

Technical Problem

In view of such a situation, an object of the present invention is to provide a surface treated copper foil satisfying all of the bonding strength to polyimide film, chemical resistance, and etching property, and to provide a CCL using the surface treated copper foil.

The present inventors studied earnestly about solubility of Ni—Zn alloy plated layer and as a result a copper foil being excellent in reliability wherein the adhesion property of circuit is hard to deteriorate even in a fine pitch circuit was obtained.

Solution to Problem

A surface treated copper foil of the present invention is a surface treated copper foil comprising an untreated copper foil on at least one surface of which Ni—Zn alloy is deposited, wherein Zn content (wt %)=Zn deposition amount/(Ni deposition amount+Zn deposition amount)×100 is 6% or more and 15% or less, and Zn deposition amount is 0.08 mg/dm$^2$ or more.

In the surface treated copper foil, preferably, the Ni deposition amount of the Ni—Zn alloy deposited on at least one surface of the untreated copper foil is 0.45 to 3 mg/dm$^2$.

A copper clad laminate of the present invention is a copper clad laminate comprising a surface treated copper foil and a polyimide film laminated on the surface treated copper foil, wherein the surface treated copper foil comprises an untreated copper foil on at least one surface of which Ni—Zn alloy is deposited, Zn content (wt %)=Zn deposition amount/(Ni deposition amount+Zn deposition amount)×100 is 6% or more and 15% or less, and Zn deposition amount is 0.08 mg/dm$^2$ or more, and an initial peel strength of bonding surface is 0.6 kN/m or more and a peel strength thereof after open-air heat test at 150° C. for 168 h retains 90% or more of the initial peel strength.

Advantageous Effects of Invention

The present invention is able to provide a surface treated copper foil satisfying all of the bonding strength to polyimide film, chemical resistance, and etching property.

Moreover, the present invention is able to provide a copper clad laminate (CCL) satisfying all of the bonding strength, chemical resistance, and etching property by using the surface treated copper foil of the present invention.

DESCRIPTION OF EMBODIMENTS

The untreated copper foil in the present invention may be either electrodeposited copper foil or rolled copper foil (when there is no necessity of particularly differentiating these, these will be sometimes simply be expressed as "copper foil" or "untreated copper foil"). The thickness of the untreated copper foil is preferably 5 μm to 35 μm. If the thickness of the copper foil is less than 5 μm, for example wrinkles are formed at the time of the production, therefore the production of thin copper foil becomes expensive to be produced and is not practical.

Further, it is because if the foil thickness is greater than 35 μm, this is out of the specifications for thinner and smaller sized IC mounted boards for driving liquid crystal displays of display parts of PCs, mobile phones, and PDAs.

As the untreated copper foil surface in the present invention, a surface roughness Rz from 0.1 μm to 1.0 μm or Ra of 0.15 μm or less is preferred.

Further, for improvement of the peel strength and chemical resistance, it is effective to perform roughening treatment. However, when considering bending property etc., roughening controlling the Rz to 1.5 μm or less is preferred.

In the present invention, surface treatment using mainly a binary alloy layer of Ni—Zn is treated to the above untreated copper foil surface, or to the surface of the roughening treated copper foil wherein roughening is treated on the untreated copper foil surface.

The reason for performing the surface treatment where Ni—Zn binary alloy layer is mainly formed on the copper foil is described below. The reason for including Ni in the Ni—Zn surface treated layer is prevention of diffusion of the copper from the copper foil into the surface treated layer. The amount of deposited Ni is preferably 0.45 mg/dm$^2$ to 3 mg/dm$^2$. If the amount of deposited Ni is 3 mg/cm$^2$ or more, in the case that etching is carried out so as not to leave behind any residue, the treatment time becomes long, therefore the problem of the circuit being shaped in a trapezoidal shape sometimes occurs, so this is not preferred. If the amount of deposited Ni is 0.45 mg/dm$^2$ or less, diffusion of copper from the copper foil easily occurs, therefore a peel strength after open-air heating can sometimes no longer retain 90% or more of the initial peel strength, so this is not preferred. When considering etching and bonding strength etc., the Ni deposition amount is preferably 0.5 mg/dm$^2$ to 2.0 mg/dm$^2$, more preferably 0.5 mg/dm$^2$ to 1.5 mg/dm$^2$.

The reason for including Zn in the surface-treated layer applied to the surface of the copper foil is improvement of the bonding strength with the resin substrate (particularly the polyimide resin layer) and prevention of deterioration of the bonding strength due to heat at the bonding.

The deposition amount of Zn is 0.08 mg/dm$^2$ or more, while the deposition ratio (Zn content) with respect to (Ni deposition amount+Zn deposition amount) is 6% or more and less than 15% (wt %, the same shall apply hereinafter), preferably 7% or more and less than 12%, more preferably 8% or more and less than 10%.

The reason for that Zn deposition amount is set to 0.08 mg/dm$^2$ or more and the deposition ratio is set to 6% or more and less than 15% is that if the deposition ratio becomes 6% or more, the heat resistance becomes improved significantly, while if the deposition ratio becomes 15% or more, the chemical resistance becomes poor.

After the above surface treatment, Cr metal, Cr hydrate or oxide, or an organic coating film is applied to the surface of that. The deposition amount of Cr is preferably 0.01 mg/dm$^2$ or more and 0.3 mg/dm$^2$ or less. If the Cr deposition amount is large, etching becomes difficult, so this not preferred. Further, if the Cr deposition amount is small, problems arise in terms of rust prevention, therefore 0.01 mg/dm$^2$ or less is not preferred. Further, as the organic coating film, a commercially available silane coupling agent etc. is applied to form a coating film.

EMBODIMENT 1

Examples 1 to 9 and Comparative Examples 1 TO 5

As the untreated copper foil, WZ copper foil having thickness of 12 μm and surface roughness of Rz: 1.0 produced by FURUKAWA CIRCUIT FOIL CO. was used.

The surface treatments were performed to these untreated copper foils according to the following processes, and surface treated copper foils having metal content and metal deposition amount as shown in Table 1 were formed.

1. Ni—Zn Alloy Plating

Ni—Zn alloy plating was performed to the untreated copper foil using following plating bath under following plating condition.

(Plating Bath and Plating Condition)

Nickel sulfate: nickel concentration of 0.1 g/L to 200 g/L, preferably 20 g/L to 60 g/L Zinc sulfate: zinc concentration of 0.01 g/L to 100 g/L, preferably 0.05 g/L to 5.0 g/L Ammonium sulfate: 0.1 to 100 g/L, preferably 0.5 to 40 g/L Bath temperature 20 to 60° C.

pH 2 to 7

Current density 0.3 to 10 A/dm$^2$

2. Surface Treatment

After Ni—Zn alloy plating, Cr treated layer and silane coupling treated layer are formed on the surface of the alloy layer to obtain test pieces.

As Cr treatment, the treatment was performed using chromic acid anhydride in the bath of the chromic acid anhydride of 0.1 g/L to 100 g/L, solution temperature: 20 to 50° C., current density: 0.1 to 20 A/dm$^2$.

As silane coupling treatment, the treatment was performed in the bath using γ-aminopropyltrimethoxysilane 0.1 g/L to 10 g/L and solution temperature of 20 to 50° C. by the method of immersion or spray etc.

The following measurements were carried out to the formed surface treated copper foils. The result of measurements is shown in Table 1.

Metal Deposition Amount

Analysis was carried out using fluorescent x-rays (Rigaku Co, ZSX Primus, analyzed diameter: 35φ).

(2) Initial Peel Strength

The surface treated test piece (copper foil) was bonded with polyimide resin (Ube industries, ltd., UPILEX 25VT) at 330° C., 20 kg/cm$^2$, for 15 min. After bonding, peel strength was measured. As for the initial peel strength, 0.6 kN/m or more is acceptable, and judging standard is shown in Table 1.

(3) Heat Resistance (Peel Strength after Heat Treatment)

Regarding test piece after bonded with polyimide, peel strength was measured after heat treatment at 150° C. for 168 h. As the judging standard for the peel strength after heat treatment, 90% or more of the initial peel strength was acceptable. Note, the judging standard (calculation method) is shown in Table 1.

(4) Chemical Resistance (Peel Strength after Acid Treatment)

The test piece after bonded with polyimide was immersed into hydrochloric acid solution of water:hydrochloric acid=1:1 at room temperature for 1 h, peel strength was measured.

TABLE 1

| SAMPLE No. | ALLOY COMPOSITION OF COPPER FOIL SURFACE Zn/(Ni + Zn) (%) | Ni mg/dm$^2$ | Zn mg/dm$^2$ | EVALUATION ITEM PEEL STRENGTH INITIAL | HEAT RESISTANCE | CHEMICAL RESISTANCE | ETCHING PROPERTY | TOTAL DECISION |
|---|---|---|---|---|---|---|---|---|
| EXAMPLE 1 | 9 | 0.90 | 0.09 | ◎ | ◎ | ◎ | ◎ | ◎ |
| EXAMPLE 2 | 9 | 1.30 | 0.13 | ◎ | ◎ | ◎ | ◎ | ◎ |
| EXAMPLE 3 | 9 | 1.70 | 0.17 | ◎ | ◎ | ◎ | ○ | ○ |
| EXAMPLE 4 | 9 | 2.10 | 0.21 | ◎ | ◎ | ◎ | Δ | Δ |
| EXAMPLE 5 | 6 | 1.30 | 0.09 | ◎ | Δ | ◎ | ◎ | Δ |
| EXAMPLE 6 | 7 | 1.20 | 0.09 | ◎ | ○ | ◎ | ◎ | ○ |
| EXAMPLE 7 | 11 | 0.80 | 0.10 | ◎ | ◎ | ○ | ◎ | ○ |
| EXAMPLE 8 | 13 | 0.90 | 0.13 | ◎ | ◎ | Δ | ◎ | Δ |
| EXAMPLE 9 | 14 | 0.48 | 0.08 | ◎ | Δ | Δ | ◎ | Δ |
| COMPARATIVE EXAMPLE 1 | 9 | 3.10 | 0.31 | ◎ | ◎ | ◎ | X | X |
| COMPARATIVE EXAMPLE 2 | 5 | 1.50 | 0.08 | ◎ | X | ◎ | ◎ | X |
| COMPARATIVE EXAMPLE 3 | 9 | 0.70 | 0.07 | ◎ | X | ◎ | ◎ | X |
| COMPARATIVE EXAMPLE 4 | 16 | 0.70 | 0.13 | ◎ | ◎ | X | ◎ | X |
| COMPARATIVE EXAMPLE 5 | 17 | 0.40 | 0.08 | ◎ | X | X | ◎ | X |

Initial peel strength (unit kN/m)
X: less than 0.6,
Δ: 0.6 or more and less than 0.7,
○: 0.7 or more and less than 0.8,
◎: 0.8 or more
Peel strength after heat resistance test (unit kN/m)
X: less than 0.54,
Δ: 0.54 or more and less than 0.63,
○: 0.63 or more and less than 0.72,
◎: 0.72 or more
Peel strength after chemical resistance test (unit kN/m)
X: less than 0.6,
Δ: 0.6 or more and less than 0.7,
○: 0.7 or more and less than 0.8,
◎: 0.8 or more
Etching property (unit μm)
◎: less than 4.0,
○: 4.0 or more and less than 5.0,
Δ: 5.0 or more and less than 6.0,
X: 6.0 or more (5) Etching Property Circuit of width of 1 mm was formed in the test piece after bonded with polyimide by copper (II) chloride solution, bottom width and top width were measured by SEM, then difference between them was calculated. The judging standard is shown in Table 1.

Judging standard shown in Table 1 is, for each evaluation, ⊚: more preferable, ○: preferable, Δ: in the standard range, x: out of standard range.

As shown in Table 1, Ni deposition amounts of Examples 1 and 2 are 0.90 to 1.30 mg/dm$^2$ (within more preferable range of 0.5 to 1.5 mg/dm$^2$), and Zn contents are 9% (within more preferable range of 8 to 10%), each evaluation item is in more preferable range (Total decision ⊚).

Regarding Example 3, Zn deposition ratio is 9%, but Ni deposition amount is 1.7 mg/dm$^2$, and Ni deposition amount is in the preferable range which is more than the more preferable range of 1.5 mg/dm$^2$. Therefore, etching property is in the preferable range, and totally it is in the preferable range (Total decision ○).

Regarding Example 4, Zn deposition ratio is 9%, but Ni deposition amount is 2.1 mg/dm$^2$, and Ni deposition amount is more than the preferable range of 2 mg/dm$^2$. Therefore, etching property becomes Δ, but totally it is in the standard range (Total decision Δ).

Regarding Example 5, Zn deposition ratio is 6% (in the range), heat resistance becomes Δ, but totally it is in the standard range (Total decision Δ).

Regarding Example 6, Zn deposition ratio is 7%, heat resistance is in the preferable range, and totally it is in the preferable range (Total decision ○).

Regarding Example 7, Zn deposition ratio is 11% which is in the preferable range, chemical resistance is in the preferable range, and totally it is in the preferable range (Total decision ○).

Regarding Example 8, Zn deposition ratio is 13%, chemical resistance becomes Δ, but totally it is in the standard range (Total decision Δ).

Regarding Example 9, Zn deposition amount is 0.08 mg/dm$^2$ and deposition ratio is 14%, Ni is 0.48 mg/dm$^2$, therefore both heat resistance and chemical resistance are Δ, but totally it is in the standard range (Total decision Δ).

Regarding Comparative Example 1, Zn deposition ratio is 9%, but Ni deposition amount is 3.1 mg/dm$^2$, Ni deposition amount is too much (out of the range), therefore etching property becomes deteriorated and it is difficult to form fine circuit (Total decision x).

Regarding Comparative Example 2, Zn deposition ratio is 0.08 mg/dm$^2$ or more but deposition ratio is less than 6%, therefore heat resistance is out of standard range (Total decision x).

Regarding Comparative Example 3, Zn deposition ratio is 9% but deposition ratio is 0.07 mg/dm$^2$, which is less than 0.08 mg/dm$^2$, therefore heat resistance is out of standard range (Total decision x).

Regarding Comparative Example 4, Zn deposition amount is 0.13 mg/dm$^2$, which is 0.08 mg/dm$^2$ or more, but deposition ratio is 16% and too high, therefore chemical resistance is out of standard range (Total decision x).

Regarding Comparative Example 5, Zn deposition amount is 0.08 mg/dm$^2$ and deposition ratio is 17% and too high, therefore etching property is out of the range, and Ni is 0.40 mg/dm$^2$ and heat resistance is out of the range (Total decision x).

As described above, the surface treated copper foil of the present invention satisfies bonding strength with polyimide, acid resistance, and etching property, and is industrially superior surface treated copper foil.

Moreover, according to the method of surface treatment of a copper foil of the present invention, a method of surface treatment of a copper foil industrially satisfying the bonding strength with polyimide, acid resistance, and etching property is able to be provided.

Furthermore, according to the laminated circuit board of the present invention, a laminated circuit board having strong bonding strength of the copper foil with a resin substrate in particular polyimide, having acid resistance in circuit formation, and satisfying the etching property is able to be provided, and it has superior effect.

The invention claimed is:

1. A surface treated copper foil comprising an untreated copper foil on at least one surface of which Ni—Zn alloy is deposited, wherein Zn content (wt %)=Zn deposition amount/(Ni deposition amount+Zn deposition amount)×100 is 6% or more and 9% or less, and Zn deposition amount is 0.08 mg/dm$^2$ or more, and the Ni deposition amount of the Ni—Zn alloy deposited on at least one surface of the untreated copper foil is 1.2 to 3 mg/dm$^2$.

2. A surface treated copper foil as set forth in claim 1, wherein the at least one surface of the untreated copper foil includes a surface roughness (Rz) of 1.5 μm or less, or a surface roughness (Ra) of 0.15 μm or less.

\* \* \* \* \*